United States Patent [19]

Müller et al.

[11] 4,223,331

[45] Sep. 16, 1980

[54] THYRISTOR WITH TWO CONTROL TERMINALS AND CONTROL DEVICE

[75] Inventors: Elmar Müller, Alzey; Klaus Weimann, Lampertheim, both of Fed. Rep. of Germany

[73] Assignee: BBC Brown, Boveri & Company, Limited, Baden, Switzerland

[21] Appl. No.: 922,098

[22] Filed: Jul. 5, 1978

[30] Foreign Application Priority Data

Jul. 7, 1977 [DE] Fed. Rep. of Germany ....... 2730612

[51] Int. Cl.² ................................................ H01L 29/74
[52] U.S. Cl. ............................................... 357/38; 357/86; 307/252 K; 307/252 Q; 307/305
[58] Field of Search ............ 307/305, 252 A; 357/38, 357/86, 252 K, 252 Q

[56] References Cited

U.S. PATENT DOCUMENTS

| | | | |
|---|---|---|---|
| 3,476,989 | 11/1969 | Miles et al. | 307/305 |
| 3,526,815 | 9/1970 | Svedberg et al. | 357/38 |
| 3,566,211 | 2/1971 | Svedberg | 357/38 |
| 3,794,890 | 2/1974 | Weimann et al. | 357/38 |

Primary Examiner—Joseph E. Clawson, Jr.
Attorney, Agent, or Firm—Oblon, Fisher, Spivak, McClelland & Maier

[57] ABSTRACT

A thyristor having a common-anode main thyristor and auxiliary thyristor combination integrated in a semiconductor chip with at least four alternating zones of different conductivity types. A first control electrode contacts a small-area control zone recessed in an emitter region. A first ring zone which is at least as highly n-doped as an emitter zone is disposed in the recessed control zone and is partially contacted by a second control electrode, as is also a portion of a p-doped base zone emerging at various places on the chip surface, the p-doped base zone forming a shorted auxiliary emitter. The second control electrode as well as the first control electrode, have leads separately brought out of the thyristor case, as are leads connected to a main cathode terminal and an auxiliary cathode terminal. The second control electrode together with the auxiliary cathode terminal can be used as a trigger-pulse source, or the second control electrode can alone be used as the trigger input to the thyristor.

3 Claims, 1 Drawing Figure

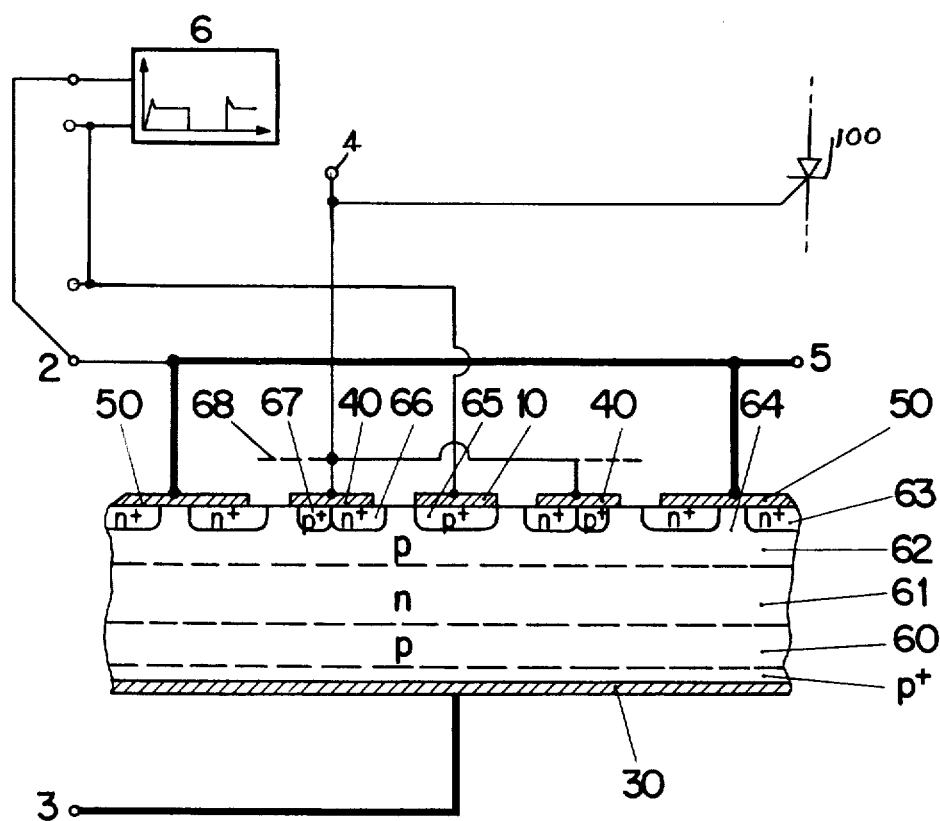

THYRISTOR WITH TWO CONTROL TERMINALS AND CONTROL DEVICE

BACKGROUND OF THE INVENTION

1. Field of the Invention

The invention relates to a thyristor with a common-anode main and auxiliary thyristor integrated in a wafer-like semiconductor chip with at least four alternating zones of different conductivity types.

2. Description of the Prior Art

In a known thyristor, a first control electrode, with a first control terminal lead brought out through the thyristor case, contacts a small-area control zone recessed in the emitter zone. Disposed in this recess and around the small-area contact is a first ring zone which is at least as highly n-doped as the emitter zone and which is partially contacted, as also is a portion of a p-doped base zone emerging at various places on the chip surface in forming a shorted auxiliary emitter, by a second control electrode intended for the auxiliary thyristor (amplifying gate), which is provided with a second control terminal lead brought out through the thyristor case and which is further provided with a control device for the same. This thyristor, as described above, is used as a power thyristor with appropriate field of application, e.g. for a rectifier-fed supply, in which parallel-connected thyristors are used.

Such a known type of power thyristor, to improve its control characteristics, has distributed over its surface slave control electrodes driven from the amplifying gate over blocking-layer-free conducting paths (DT-OS No. 21 46 178). An external connection to these conducting paths, herein called a second control terminal, is provided in the known case. For control of several parallel-connected power thyristors, control power must be supplied, which increases with the number of parallel-connected thyristors. The known power thyristor as well as the usual power thyristor of today possess a gate arrangement with internal firing or control current amplification, the aforementioned amplifying gate (e.g. U.S. Pat. Nos. 3,476,989; 3,579,060; 3,590,346 and General Electric Publication 671.15, 3/1969 "The Amplifying Gate SCR"). Amplifying gate thyristors however generally have longer turn-on times than thyristors with the "normal" control zone-control electrode arrangement (normal gate). In the first mentioned known case the thyristor is triggered via the first control terminal with propagation of the firing process through the amplifying gate and the slave control electrodes which provide for a uniform firing process distributed over the thyristor surface.

The arrangement of adjacent differently doped and sometimes highly doped ring zones, contacted by a control electrode with an external control terminal, is straight-forward in a thyristor with integrated auxiliary thyristor (DT-OS No. 15 89 455). In the known case, however, there is an external connection to discrete components in order to obtain simultaneous initiation of the firing process in the auxiliary thyristor(s) and the main thyristor.

SUMMARY OF THE INVENTION

Accordingly, objects of this invention are to provide a novel thyristor which retains the internal firing-current amplification feature and thus the ability to fire with low control current, and which has improved connections which enable optional parallel operation with additional power thyristors and firing with short turn-on time.

These and other objects of this invention are achieved by providing a second control electrode which is usable both as a control pulse source together with an auxiliary cathode terminal lead brought out through the thyristor case in addition to the cathode terminal lead, as well as being usable by itself as a control input for the thyristor, thereby acting as a signal generator or a signal receiver.

In triggering the thyristor via the first control terminal utilizing the internal firing-current amplification and the corresponding firing process, a positive voltage pulse develops between the auxiliary cathode terminal and the second control terminal. The second control terminal consequently can advantageously serve as:

(a) a trigger generator for firing one or more additional thyristors, whereby a redundant control of several thyristors also is possible, i.e. some thyristors are connected both to their actual control or triggering device and to one another via their second control terminals, so that failure of a firing circuit for one thyristor is not a problem;

(b) a pulse source for other control or regulation processes;

(c) a short turn-on time firing mechanism, upon the application of a control pulse, without the action of the internal firing-current amplification.

Expediently, the second control electrode contacts a p±doped second ring zone which lies between the highly doped, or n+-doped first ring zone, and the contacted portion of the base zone, on the emitter zone side of the thyristor. The p+doped second ring zone, in the triggering of the thyristor via the first control terminal, enhances the straight forward manner of operation of the amplifying gate by strong lateral hole injection into the emitter zone, which is also favorable for the above described further signal processing of the output signal at the second control terminal.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein:

The Single drawing is a schematical cross-sectional view of the thyristor semiconductor wafer, with connections of the invention.

DETAILED DESCRIPTION OF THE PREFERRED EMBODIMENTS

Referring now to the drawing, there is seen a thyristor wafer which exhibits as external connections a first control terminal 1, an additional auxiliary cathode terminal 2, an anode terminal 3, an additionally brought out second control terminal 4 and a cathode or emitter terminal 5. The representation of the terminals is schematic; in actual construction in general, straight-forward pressure contacts can be provided, at least for the main electrodes. An additional cathode terminal is known (e.g. Heumann/Stumpe "Thyristors" third edition (1974)).

For triggering there serves a straightforward control device 6 (BBC-Silicon Rectifier Manual first edition (June, 1971), p. 52; VDE-Book Series Vol. 11, "Energie-elektronik urd geregelte elektrische Antriebe" [High Power Electronics and Regulated Electronic Supplies] July, 1966, VDE-Press, pp. 223-236), by which the known trigger pulse with short-duration high pulse peaks and then constant pulse height or even a pulse spike can be produced. In the drawing the control device 6 is connected to the first control terminal 1 and the auxiliary cathode terminal 2. As already explained, the second control terminal can be connected to a control input of another thyristor 100, or similar device, as shown schematically in the drawing, from which the required control pulse for the other thyristor can be derived. Further, the control device 6 can serve for triggering via the first control terminal 1 or the second control terminal 2.

On the wafer surface is provided a series of metallizations which serves as the electrodes 10, 50, 30, 40, 50.

The wafer exhibits four alternating zones of different conductivity types: a p-doped anode zone 60, which can be more heavily or p+-doped next to the anode electrode 30; and n-doped middle zone 61; a p-doped base zone 62 and an n+-doped emitter zone 63, which can be penetrated at points (emitter short circuits or shortings) by regions 64 of the base zone 62 reaching to the emitter electrode 50. Under the first control electrode 10 there is a p+-doped control zone 65. Under the second control electrode 40 is an n+-doped first ring zone 66, which is not contacted, on a small interior ring surface, and a p+-doped second ring zone 67, with the control electrode 40 contacting this zone 67 and a portion of the base zone 62 reaching the top wafer surface between 67 and the emitter zone 63. Leads 68 to further contacts or slave control electrodes (not shown) can be connected to the control electrode 40, or the second control terminal 4, as in the thyristor of DT-OS No. 21 46 178.

The operation of the thyristor will be explained below, where the internal processes in the thyristor with amplifying gate will be assumed to be known from the aforementioned literature. To fire the thyristor a positive trigger pulse is applied between the terminals 1 and 2, as represented by the dashed connection between 1 and 6 (with positive anode-cathode voltage between the terminals 3 and 5). Turning on the thyristor gives rise to a positive voltage pulse between the terminals 4 and 2, which is independent of the thyristor firing pulse. The amplitude of the pulse generated between terminals 4 and 2 depends (naturally apart from the technology) on the current rise-rate in the load circuit. The terminals 4 and 2 can be considered as those of a trigger generator, which draws its power from the main circuit of the thyristor. If in other applications, e.g. at high switching frequency, a thyristor with short turn-on time is desired, one fires the thyristor with amplifying gate between the terminals 2 and 4. The amplifying gate acts in this case as a "normal gate" with short turn-on time.

Of course the first control electrode 10 and the control zone 65 are preferably, but not necessarily, centrally arranged. Further, the wafer can be round or square. Its edge, as usual, is chamfered and provided with a passivating layer in order to increase the voltage breakdown strength and to stabilize the electrical properties.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A new use for a first thyristor composed of a common-anode main and auxiliary thyristor combination integrated in a wafer-like semiconductor chip with at least four alternating zones of different conductivity types housed in a thyristor case, said thyristor having a first control electrode, said first thyristor having a first control terminal lead brought out through the thyristor case, said first control electrode contacting a small-area control zone recessed in an emitter zone and there being disposed in this recess and around the small-area control zone a first annular zone which is at least as highly n-doped as the emitter zone and which is partially contacted by a second control electrode used as an auxiliary thyristor amplifying gate, said thyristor provided with a second control terminal contacting the second control electrode and brought out through the thyristor case, said first thyristor further having a portion of a p-doped base zone emerging at various places through the emitter zone to the chip surface and contacting shorted auxiliary cathode electrode connected to a cathode terminal, said portion of p-doped base zone also contacted by said second control electrode which is provided with a second control terminal lead brought out through the thyristor case, comprising:

connecting said first thyristor in a circuit with a second thyristor with the second control terminal of said first thyristor connected to a control terminal of said second thyristor; and applying a control input from a control impulse source to the first control terminal of said first thyristor, thereby developing a positive voltage between the second control terminal and the shorted auxiliary cathode terminal of said first thyristor;

wherein the positive voltage developed on said second control terminal of said first thyristor is transferred to the control terminal of said second thyristor to generate an ignition current in said second thyristor, whereby said first and second thyristors are ignited.

2. A new use according to claim 1, wherein said second thyristor is similarly constructed as said first thyristor, and said connecting step comprises connecting the second control terminal of said first thyristor to the second control terminal of said second thyristor.

3. A new use for a first thyristor according to claims 1 or 2 wherein the second control electrode of said first thyristor contacts a p+-doped second annular zone located between the first annular zone and the contacted partial area of the base zone on the side of said first annular zone facing said emitter zone.

* * * * *